United States Patent

Giontzeneli et al.

[15] 3,651,420

[45] Mar. 21, 1972

[54] VARIABLE GAIN DIRECT COUPLED AMPLIFIER

[72] Inventors: Kiamil Giontzeneli, Plano, Tex.; Philip E. Hermann, Lansdale, Pa.

[73] Assignee: Philco-Ford Corporation, Philadelphia, Pa.

[22] Filed: Jan. 13, 1970

[21] Appl. No.: 2,488

[52] U.S. Cl. .................. 330/19, 330/29

[51] Int. Cl. .................. H03f 3/42, H03g 3/30

[58] Field of Search .................. 330/19, 29, 30, 30 D, 38 M, 330/69

[56] References Cited

UNITED STATES PATENTS

| | | | |
|---|---|---|---|
| 3,368,156 | 2/1968 | Kam | 330/29 X |
| 3,210,683 | 10/1965 | Pay | 330/29 X |
| 3,502,997 | 3/1970 | Narud | 330/29 |

*Primary Examiner*—Roy Lake
*Assistant Examiner*—Lawrence J. Dahl
*Attorney*—Herbert Epstein

[57] ABSTRACT

A transistor amplifier comprising input circuitry for simultaneously adjusting, in response to a control signal, the gain of a transistor amplifying stage and the magnitude of its input signal, and output circuitry for maintaining constant the DC output voltage of the stage as the gain of the stage is varied.

The input circuitry includes a control transistor whose collector to emitter path is comprised in the output legs of first and second voltage dividers. A gain control signal, e.g., an AGC signal, applied to the base of the control transistor controls the collector to emitter resistance of the control transistor, thereby controlling simultaneously the respective voltage divisions effected by the two dividers. The first divider controls the gain of the transistor amplifying stage by controlling its operating bias, and the second divider determines the fraction of the input signal applied to the amplifying stage.

The output circuitry includes a third transistor the collector and emitter of which are directly connected to the collector and emitter respectively of the amplifying transistor and the base of which is supplied with the gain control signal. The two transistors share the same collector load resistor. As the gain control signal varies, the DC collector current of the third transistor changes in a direction opposite to that in which the collector current of the amplifying transistor changes, and by a substantially equal amount. Since the amplifying and third transistors share the same load resistor, the net DC current therethrough remains constant. Hence the DC output voltage of the stage also remains constant.

12 Claims, 1 Drawing Figure

PATENTED MAR 21 1972 3,651,420
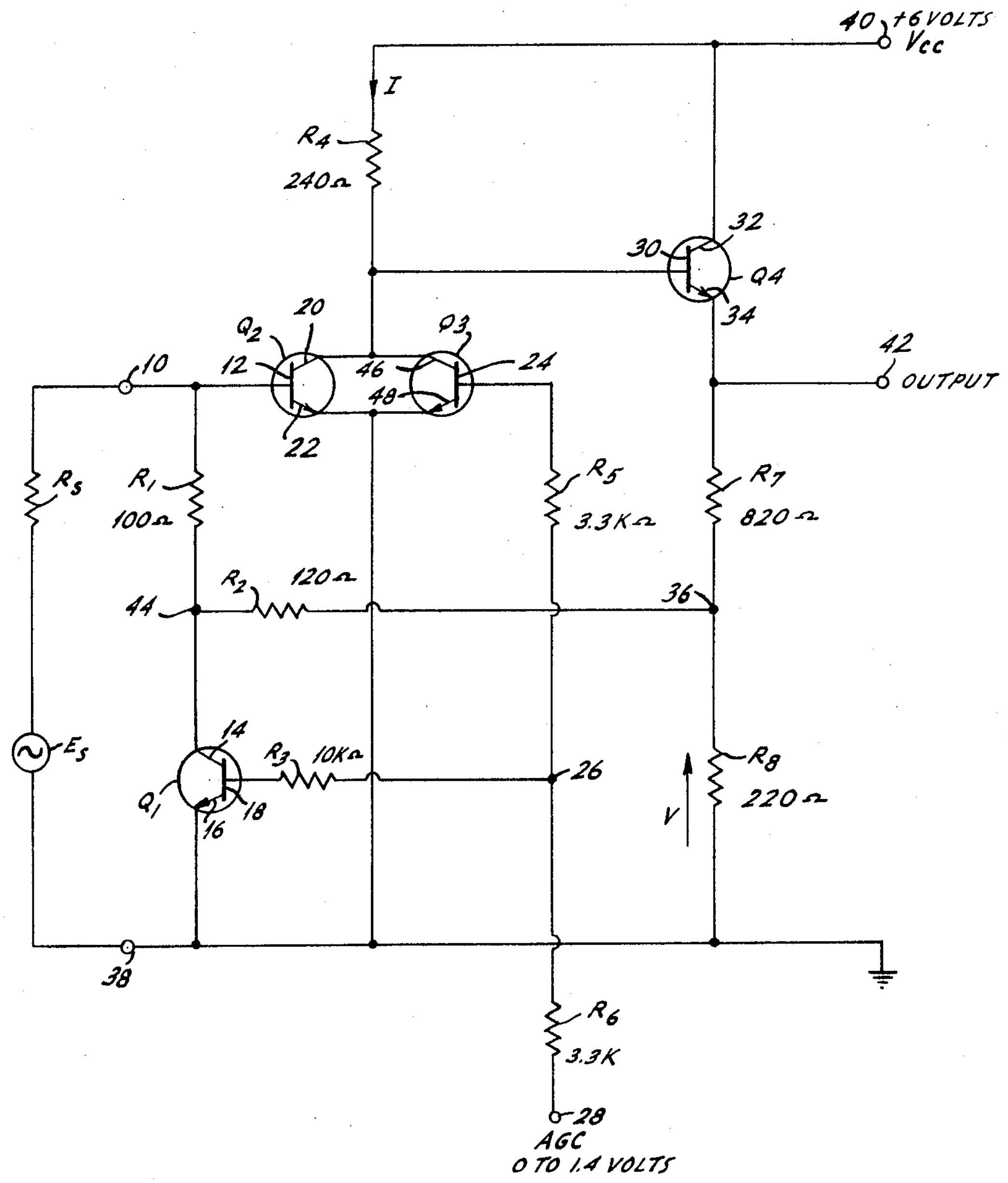
INVENTORS
PHILIP E. HERMANN
KIAMIL GIONTZENELI
BY
Herbert Epstein
ATTORNEY

VARIABLE GAIN DIRECT COUPLED AMPLIFIER

This invention relates to gain controlled amplifiers and more particularly to a transistor amplifier which can maintain a linear response under low gain conditions, and a constant DC output level as its gain is varied.

Gain controlled transistor amplifiers have many applications in situations when it is desired to maintain a constant signal output level over a wide dynamic range of input signals. Such amplifiers are commonly used in receivers for radio, television, radar, and communications equipment.

The most common method for controlling the gain of transistor amplifiers is to control the DC collector current of the amplifying stage. For values of DC collector current greater than a given value, the gain of the amplifier varies in inverse relation to the value of the DC collector current. For values of DC collector current less than said given value, the gain of the amplifier varies in direct relation to the value of the DC collector current with the relationship becoming more nearly linear at lower collector currents.

Two troublesome problems arise when gain is controlled in this manner. When the DC collector current is reduced to a very low value to achieve a very low gain, large input signals tend to drive the transistor into cutoff, causing distortion of the output signal of the transistor stage. To avoid such distortion, prior art arrangements have avoided reducing the DC collector current below a minimum value higher than that to which it could be reduced and yet afford linear amplification of small signals. As a result the range of gain control of such arrangements has been correspondingly limited.

In addition, as the gain is varied, the collector current and therefore the voltage drop across the collector load resistor varies. This causes the DC collector voltage to vary as the gain is changed, which necessitates use of a DC blocking capacitor between the output of the amplifying stage and the input of the next stage to prevent undesirable shifting of the bias of the latter stage. The disadvantages of using a blocking capacitor are that (1) a negative DC feedback loop cannot be used to establish a stable initial operating point for the amplifier, and (2) either a very large blocking capacitor must be used or poor low frequency operation due to the impedance drop of the capacitor must be tolerated.

Accordingly, an object of this invention is to provide improved gain controllable amplifiers.

Another object is to provide a gain controllable transistor amplifier which maintains a constant DC output voltage as gain is varied.

Another object is to provide a gain controllable transistor amplifier having an extended range of gain control and capable of amplifying linearly input signals having a wide range of amplitudes.

DRAWING

The single figure of the drawing is a schematic diagram of a variable gain, direct coupled transistor amplifier according to the invention.

DESCRIPTION OF CIRCUIT

The transistor amplifier according to the invention, illustrated in the drawings, comprises an amplifier transistor Q2, a transistor Q1 for simultaneously controlling, in response to an automatic gain control signal, both the gain of transistor Q2, and the amplitude of its input signal, a transistor Q3 responsive to the automatic gain control signal to maintain constant the DC voltage at the output of transistor Q2, and an output transistor Q4 for reducing the output impedance of the amplifier and for supplying DC bias via a DC negative feedback path to amplifying transistor Q2.

Transistor Q2 is connected in common-emitter configuration. The emitter 22 of transistor Q2 is connected to a point 38 at reference potential, e.g., ground, and its collector 20 is connected at a terminal 40 to positive bias source *Vcc* by way of a load resistor R4. An input terminal 10 is connected to the base 12 of transistor Q2. To supply an input signal to transistor Q2, a source of an input signal, represented in the drawing by an alternating voltage generator *Es* having an internal resistance *Rs*, may be connected between terminals 10 and 38.

The collector 20 of amplifier transistor Q2 is connected directly to the base 30 of output transistor Q4, which is connected in emitter follower configuration. The collector 32 of transistor Q4 is connected directly to terminal 40 and the emitter 34 of transistor Q4 is connected to ground 38 by way of series-connected output resistors R7 and R8. An output terminal 42 is connected to emitter 34. The junction 36 of resistors R7 and R8 is connected to the base 12 of transistor Q2 by way of resistor R2 and resistor R1, which together constitute a DC negative feedback path from transistor Q4 to transistor Q2.

The collector 14 of control transistor Q1 is connected to the junction 44 of resistors R1 and R2 and the emitter 16 of Q1 is directly connected to ground 38. A terminal 28 is provided for the automatic gain control (AGC) signal, which is supplied to the base 18 of transistor Q1 by way of an isolating resistor R6 and a base current control resistor R3. The AGC signal may be produced by a conventional arrangement (not shown) comprising for example an envelope detector and low pass filter, which, in response to an input signal supplied to terminal 10, produces a voltage positive with respect to ground, the magnitude of which voltage varies in direct relation to the amplitude of the input signal.

The collector 46 of transistor Q3 is connected directly to collector 20 of transistor Q2, and the emitter 48 of transistor Q3 is connected directly to emitter 22 of transistor Q2. Accordingly transistors Q2 and Q3 share the same collector load resistor R4. The AGC signal is applied to base 24 of transistor Q3 by way of terminal 28, isolating resistor R6 and a base current control resistor R5.

Exemplary component and voltage values are indicated in the drawings. However components and voltages having different values also can be used. Transistors Q1 to Q4 typically have a beta of about 50. PNP-transistors can be used in lieu of the NPN-transistors shown, provided that the respective polarities of the supply voltage Vi cc and AGC signal are reversed.

OPERATION OF CIRCUIT

INTRODUCTION

The gain of amplifying transistor Q2 is determined by the value of the DC bias applied between its base 12 and its emitter 22. The value of this bias depends on the value of the voltage V appearing between junction 36 and ground 38, i.e., across resistor R8, since junction 36 is directly connected to base 12 via resistors R2 and R1. This value depends also on the resistance of the collector-emitter path of transistor Q1, since that path shunts resistors R8 and R2. The collector-emitter path resistance in turn, depends on the value of the AGC signal supplied to base 18. For reasons discussed hereinafter, the gain of transistor Q2 is a maximum when the AGC signal is zero and decreases as that signal becomes increasingly positive with respect to ground.

OPERATION WHEN AGC SIGNAL IS ZERO

When the AGC signal at terminal 28 is zero, the DC voltages at base 18 of transistor Q1 and at base 24 of transistor Q3 are also zero. Since the emitters 16 and 48 of transistors Q1 and Q3 respectively are at ground, i.e., zero, potential, transistors Q1 and Q3 are cut off. Consequently their respective collector-emitter paths are in effect open circuited, and therefore transistors Q1 and Q3 have no effect on the operation of the remainder of the circuit. Hence the bias potential applied to base 12 of transistor Q2 depends directly on the voltage V developed across resistor R8 by the flow therethrough of the DC emitter current of transistor Q4. Since (*i*) this emitter current in turn depends directly on the DC potential of base 30 of transistor Q4, (*ii*) that potential is equal to the potential of collector 20 of transistor Q2, and (*iii*) the latter potential depends inversely on the potential of base 12, determined by voltage V, the base bias of transistor Q2 tends to remain at a constant value. By use of appropriately-valued components, this constant value is caused to be such as to operate transistor Q2 in the linear portion of its characteristic. The manner of ascertaining such component values is well known to those skilled in the design of transistor amplifiers and therefore need not be discussed further herein.

OPERATION WHEN AGC SIGNAL IS POSITIVE WITH RESPECT TO GROUND

When the AGC signal at terminal 28 rises above zero, base 18 of transistor Q1 receives a positive bias voltage which drives transistor Q1 into conduction. Conduction of transistor Q1 in response to the AGC signal 28 produces the following two simultaneous beneficial effects in accordance with the invention:

(1) the magnitude of the input signal at base 12 of transistor Q2 is decreased as the AGC signal is increased. More particularly, the magnitude of that portion of the input signal, generated by source E*s*, which appears at the base 12 of transistor Q2 is primarily determined by the magnitude of said input signal and the respective resistances of R*s*, R1, R2, R8, and the emitter-collector path of transistor Q1, which together form a first voltage divider. As transistor Q1 is driven from cutoff into conduction by the AGC signal, the resistance of its emitter-collector path, connected in parallel with the series combination of resistors R2 and R8, decreases. As a result, the voltage drop of input signal voltage across Rs increases and the magnitude of the portion of input signal voltage appearing at base 12 decreases. When R*s* is large in comparison with the resistance between the base 12 of transistor Q2 and ground 38, e.g., ten times larger than this resistance, a reduction of input signal amplitude at base 12 of the order of four to one can be achieved as transistor Q1 is driven by the AGC signal from cutoff toward saturation conduction. In the event that the internal resistance Rs of source EsYis too low to provide the desired range of attenuation of the input signal, a resistor (not shown) may be connected in series with source is to provide a suitably high resistance.

(2) The gain of transistor Q2 is decreased as the AGC signal is increased. More particularly, resistor R2 and the emitter-collector path of transistor Q1 constitute a second voltage divider which determines the magnitude of the portion of voltage V, developed across resistor R8, which is applied via resistor R1 to the base 12 of transistor Q2 as a bias voltage. As transistor Q1 is driven from cutoff into conduction by an increasingly positive AGC signal, its emitter-collector path presents a decreasing resistance. Since the resistance of R2 remains constant, a smaller portion of voltage V is applied by R1 to the base 12 of transistor Q2. As a result, the gain of transistor Q2 falls. In this manner the operating point of the amplifying stage, and thereby its gain, is controlled by the AGC signal. Because the reduction in gain of transistor Q2 is accompanied by a simultaneous decrease in the magnitude of the portion of input signal applied to base 12 of transistor Q2, the input signal has less tendency to drive transistor Q2 into the nonlinear region of its characteristic. Hence the gain of Q2 may be reduced, without distortion of the signal being amplified, to a lower minimum value than that feasible in prior art arrangements.

Transistor Q3, in response to the AGC signal applied to its base 24 via resistors R6 and R5, produces the additional beneficial effect of maintaining the DC voltage at the collector 20 of transistor Q2 constant as the gain of transistor Q2 is varied by the same AGC signal. Consequently that voltage can be applied directly to the base 30 of emitter-follower transistor Q4 as a fixed bias, and no blocking capacitor is required.

More particularly as aforedescribed, an increase in the AGC signal decreases the DC bias applied to base 12 of transistor Q2. This decrease in base bias decreases the collector current of transistor Q2, causing the voltage drop in resistor R4 to decrease. As a result the voltage at the collector 20 of transistor Q2 tends to rise toward the supply voltage V*cc*. In accordance with the invention, the voltage at collector 20 is maintained substantially constant by increasing the collector current of transistor Q3 by an amount substantially equal to the decrease in collector current of transistor Q2. This increase in collector current is obtained by applying the increasing AGC signal to base 24 of transistor Q3. Since the net DC current I through collector load resistor R4 is substantially equal to the sum of the respective DC collector currents of transistors Q2 and Q3 (the base current of transistor Q4 being negligible in comparison therewith), the voltage drop across R4 and the voltage at the collector 20 of transistor Q2 are maintained constant, even though the gain of amplifying transistor Q2 is varied greatly by large variations in the AGC signal. In addition, because direct connection between transistors Q2 and Q4 is made feasible by transistor Q3, good low frequency performance is readily obtained and a stable initial operating point for amplifying transistor Q2 is achieved by use of degenerative DC feedback from junction 36 to junction 44.

The circuit shown in the drawing has been built and tested in integrated form and provides 40 db. of linear gain control in response to variation of the AGC voltage from .3 to 1.4 volts. This invention is particularly suitable for integrated circuit applications because of its use of only transistors and resistors as circuit elements and because of the close tracking of operating characteristics among the transistors located on a given chip. However the invention is not limited to integrated circuits, but may also be embodied in arrangements made from discrete components. Preferably the transistors should have similar operating characteristics.

In addition, the invention is not limited to automatic gain control systems, but also encompasses systems in which a manually controllable DC bias is applied to terminal 28 in place of the AGC signal. Such a bias may be applied by connecting a potentiometer across a source of DC voltage (not shown), connecting the variable arm of the potentiometer to terminal 28, and connecting a fixed tap on the resistance element of the potentiometer to ground terminal 38.

Although the invention has been exemplified by a circuit employing a common-emitter amplifier stage as the gain-controlled stage, it can also be embodied in an arrangement for controlling the gain of a common base amplifier stage, with only minor circuit modifications. Similarly, the invention can be applied to circuits using active elements other than bipolar transistors, such as vacuum tubes or field effect transistors.

We claim:

1. In an amplifier comprising:

a. first amplifying means having a control element and first and second electrodes and responsive to variations in a signal applied to said control element to vary an electric current flowing through said second electrode, and means for applying a time-varying signal between said control element and said first electrode, b. direct-current-conductive means for connecting said first electrode to a point at reference potential, c. first resistive means for connecting said second electrode to a source of operating potential and for conducting the time-varying electric current flowing through said second electrode in response to said time-varying input signal, thereby to produce a time-varying voltage across said first resistive means, and, d. means for supplying a control signal to said control element, the value of the current flowing in said second electrode and said first resistive means changing (*i*) in a given direction in response to a variation in a certain sense of the magnitude of said control signal and (*ii*) by an amount dependent on the extent of said magnitude variation of said control signal, the improvement comprising e. second amplifying means having a control element and first and second electrodes and responsive to variations in a signal to vary an electric current flowing through said second electrode thereof, means directly connecting said first electrode of said second amplifying means to said first electrode of said first amplifying means, and means directly connecting said second electrode of said second amplifying means to said second electrode of said first amplifying means, and f. means for supplying said control signal to said control element of said second amplifying means in a sense such as to change in a given direction the value of said current flowing through said second electrode of said second amplifying means when the value of said current flowing through said second electrode of said first amplifying means is changed by said control signal supplied to said control electrode of said first amplifying means, in a direction opposite said given direction.

2. An amplifier according to claim 1, wherein said means for supplying said control signal to said control element of said first amplifying means comprises:

a. third amplifying means comprising a control element and first and second electrodes and responsive to variations in a signal applied to said control element thereof to vary an electric current flowing through said second electrode thereof.

b. means directly connecting said first electrode thereof to said first electrode of said first amplifying means, c. second resistive means connecting said second electrode of said third amplifying means to said control element of said first amplifying means, d. third resistive means connecting said second electrode of said third amplifying means to a source of bias potential other than said operating potential, and e. means for supplying said control signal to said control element of said third amplifying means,

3. An amplifier according to claim 2, wherein said source of bias potential comprises fourth amplifying means having a control element and first and second electrodes and responsive to variations in a signal applied to said control element to vary an electric current flowing through said second electrode thereof, means directly connecting said control element of said fourth amplifying means to said second electrode of said first amplifying means, means directly connecting said first electrode of said fourth amplifying means to a source of operating potential, fourth resistive means connecting said second electrode of said fourth amplifying means to said third resistive means at a junction, and fifth resistive means connecting said junction to said point at reference potential, and wherein said third resistive means connects said junction to said second electrode of said third amplifying means.

4. An amplifier according to claim 1, wherein each of said first amplifying means and said second amplifying means is a bipolar transistor having a base of given conductivity type.

5. An amplifier according to claim 1, wherein each one of said first and said second amplifying means comprises a bipolar transistor having an emitter electrode, a collector electrode, a base electrode and a base of given conductivity type, said emitter electrode, said collector electrode and said base electrode being respectively said first electrode, said second electrode and said control element of said one of said two amplifying means.

6. An amplifier according to claim 2, wherein each one of said first, second and third amplifying means comprises a bipolar transistor having an emitter electrode, a collector electrode, a base electrode and a base of given conductivity type, said emitter electrode, said collector electrode and said base electrode being respectively said first electrode, said second electrode and said control electrode of said one of said three amplifying means.

7. An amplifier according to claim 3, wherein each one of said first, second and third amplifying means comprises a bipolar transistor having an emitter electrode, a collector electrode, a base electrode and a base of given conductivity type, said emitter electrode, said collector electrode and said base electrode being respectively said first electrode, said second electrode and said control electrode of said one of said three amplifying means, and said fourth amplifying means comprises an additional bipolar transistor having an emitter electrode, a collector electrode a base electrode and a base of said given conductivity type, said emitter electrode, said collector electrode and said base electrode of said additional transistor being respectively said second electrode, said first electrode and said control electrode of said fourth amplifying means.

8. In an amplifier comprising:

a. first amplifying means having a control element and first and second electrodes and responsive to variations in a signal applied to said control element to vary an electric current flowing through said second electrode, b. means for applying a time-varying input signal between said control element and said first electrode, c. direct-current-conductive means for connecting said first electrode to a point at reference potential, d. first resistive means for connecting said second electrode to a source of operating potential and for conducting the time-varying electric current flowing through said second electrode in response to said time-varying input signal, thereby to produce a time-varying voltage across said first resistive means, and e. means for applying a control signal to said control element, the improvement comprising f. second amplifying means comprising a control element and first and second electrodes and responsive to variations in a signal applied to said control element thereof to vary an electric current flowing through said second electrode thereof, g. means directly connecting said first electrode of said second amplifying means to said first electrode of said first amplifying means, h. second resistive means connecting said second electrode of said second amplifying means to said control element of said first amplifying means, i. third resistive means connecting said second electrode of said second amplifying means to a source of bias potential different from said operating potential, and j. means for supplying said control signal to said control element of said second amplifying means.

9. An amplifier according to claim 8, wherein each one of said first and said second amplifying means comprises a bipolar transistor having an emitter electrode, a collector electrode, a base electrode and a base of given conductivity type, said emitter electrode, said collector electrode and said base electrode being respectively said first electrode, said second electrode and said control element of said one of said two amplifying means.

10. An amplifier according to claim 8, wherein said means for applying said input signal comprises resistive means connected to said control element of said first amplifying means.

11. An amplifier according to claim 8, wherein:

a. said means for applying said input signal comprises resistive means connected to said control element of said first amplifying means, and b. each one of said first and said second amplifying means comprises a bipolar transistor having an emitter electrode, a collector electrode, a base electrode and a base of given conductivity type, said emitter electrode, said collector electrode and said base electrode being respectively said first electrode, said second electrode and said control element of said one of said two amplifying means.

12. An amplifier according to claim 3, wherein said means for applying said input signal comprises resistive means having one terminal connected to said control electrode of said first amplifying means and having a second terminal for receiving said input signal.

* * * * *

PO-1050
(5/69)

UNITED STATES PATENT OFFICE
CERTIFICATE OF CORRECTION

Patent No. 3,651,420 Dated March 21, 1972

Inventor(s) Kiamil Giontzeneli, Philip E. Hermann

It is certified that error appears in the above-identified patent and that said Letters Patent are hereby corrected as shown below:

Column 2, line 40 (sixth line of fourth full paragraph): change "Vi cc" to --Vcc--

Column 3, line 40 (twentieth line of second full paragraph): after "Es" delete "$\Upsilon$"

Column 3, line 42 (twenty-second line of second full paragraph): after "source" change "is" to --Es--

Signed and sealed this 25th day of July 1972.

(SEAL)
Attest:

EDWARD M.FLETCHER,JR.
Attesting Officer

ROBERT GOTTSCHALK
Commissioner of Patents